United States Patent [19]

Brown

[11] 4,172,290

[45] Oct. 23, 1979

[54] CLOSED LOOP PROPAGATION PATTERN FOR BUBBLE LATTICES

[75] Inventor: Byron R. Brown, San Jose, Calif.

[73] Assignee: International Business Machines Corporation, Armonk, N.Y.

[21] Appl. No.: 917,611

[22] Filed: Jun. 21, 1978

[51] Int. Cl.$^2$ ............................................. G11C 19/08
[52] U.S. Cl. ........................................ 365/3; 365/14; 365/35; 365/43
[58] Field of Search ........................ 365/3, 14, 15, 35

[56] References Cited

U.S. PATENT DOCUMENTS

| 3,806,901 | 4/1974 | Buhrer | 365/15 |
| 3,953,841 | 4/1976 | Voegeli | 365/14 |
| 4,067,002 | 1/1978 | Chang | 365/3 |

Primary Examiner—James W. Moffitt

Attorney, Agent, or Firm—Joseph E. Kieninger

[57] ABSTRACT

A bubble storage system includes a closed loop propagation pattern suitable for use with a bubble lattice. The closed loop propagation pattern is folded and contains, for example, segments of a hexagonal lattice connected by 60° turns to obtain a close pack bubble storage configuration. The bubbles are propagated along the pattern consisting, preferably, of C-bar or chevron type permalloy elements by a rotating magnetic field in the plane of the pattern. In a preferred embodiment, the folded closed loop propagation pattern is surrounded by a region of non-propagating bubbles retained by permalloy dot confinement means. There are substantially the same number of elements in the propagation pattern as there are bubbles in the lattice that are affected by the propagation elements.

8 Claims, 1 Drawing Figure

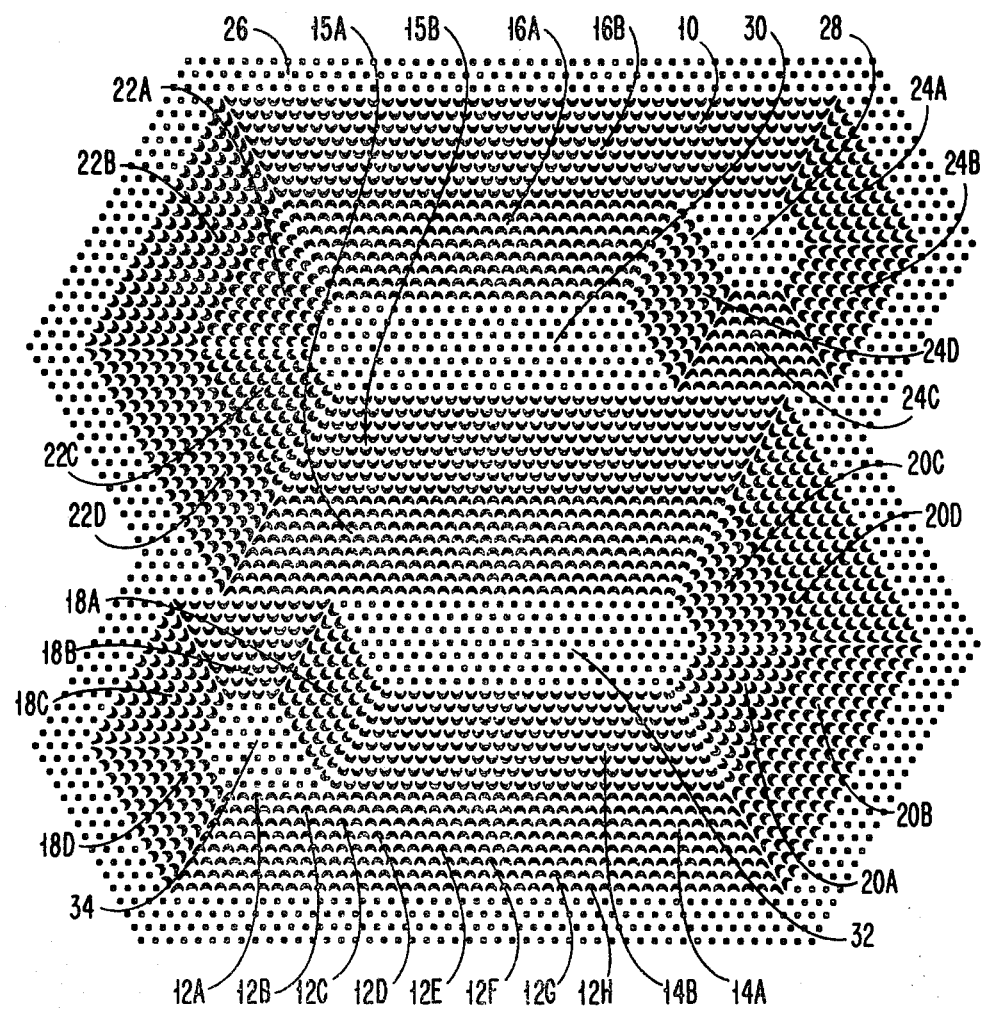

CLOSED LOOP PROPAGATION PATTERN FOR BUBBLE LATTICES

DESCRIPTION

Technical Description

This invention relates to a field access bubble lattice device, and more particularly a closed loop bubble propagation pattern that is folded.

It is a primary object of this invention to provide an improved bubble lattice system.

It is another object of this invention to provide a bubble lattice system that functions in the absence of a structured buffer region.

It is still another object of this invention to provide a bubble lattice propagation system that does not require the generation or annihilation of bubbles.

It is yet still another object of this invention to provide a bubble lattice system that has a relatively low sensitivity to defects.

It is a further object of this invention to provide an improved propagation pattern.

It is a still further object of this invention to provide an improved closed loop propagation pattern.

BACKGROUND ART

Bubble domains arranged in a lattice are described in U.S. Pat. Nos. 3,930,244 and 4,052,710 which are assigned to the assignee of the present invention. The aforementioned patents are incorporated herewith by reference thereto. As described therein the bubble domain lattice consists of a plurality of rows and columns of bubble domains which occupy a spatial arrangement which is determined to a substantial extent by the interaction between the bubbles.

Heretofore bubble domain lattices have been in the form of a parallelogram in which there are parallel rows and columns of bubble domains. In current bubble domain lattice system designs the bubbles are translated parallel to the rows of the storage axis to position the addressed bubbles in an access channel. When the bubbles are in the access channel, these bubbles can be translated within the lattice along the channel. Such translation along the column axis is used to enter new bubbles into the lattice and to remove existing bubbles from the lattice.

Present designs of bubble lattice systems all rely on rectilinear lattice translation for data accessing. This requires means for bidirectional lattice translation and buffer regions on both sides of the lattice. In certain applications in which buffer regions of this type are not suitable, the bubble lattice requires some type of closed loop arrangement.

A bubble lattice system having a closed loop design has certain problems. A primary problem or obstacle would be that the lattice boundary cannot follow a straight line as with the standard lattice designs because the closed loop bubble lattice systems require at least one curved lattice segment. Maintaining a regular lattice in a curved portion presents a problem which must be overcome in order to have a satisfactory closed loop lattice system. In any curved portion a regular lattice is retained only if the lattice parameter increases with the radius of curvature. Unless the outer lattice boundary is very close to the inner lattice boundary, a regular lattice arrangement is not maintained throughout the whole curved segment.

One approach to a closed loop lattice system is described in U.S. Pat. No. 3,953,841, assigned to the assignee of the present invention, in which the bubble lattice system has a curved portion therein wherein the lattice parameter increases with the radius. Associated with the curved portion in a preferred embodiment is a radially varying bias field wherein the strength of said field at any position occupied by a bubble domain provides an equilibrium lattice constant which is substantially the same as the lattice parameter at that position. The method of reducing the stress in the curved portion of a bubble domain lattice system involves the step of varying the parameters which affect the equilibrium lattice constant in such a manner as to provide an equilibrium lattice constant which is substantially the same as the lattice parameter at any given position in the curved portion.

BRIEF DESCRIPTION OF THE DRAWING

In the accompanying drawing forming a material part of this disclosure:

The FIGURE is an elevational view illustrating a folded loop lattice utilizing C-bar propagation elements and dot confinement means.

DISCLOSURE OF INVENTION

For a further understanding of the invention and of the objects and advantages thereof, reference will be had to the following description and accompanying drawing, and to the appended claims in which the various novel features of the invention are more particularly set forth.

A bubble storage system includes a closed loop propagation pattern suitable for use with a bubble lattice. The closed loop propagation pattern is folded and contains segments of a uniform lattice connected in a manner to provide that the propagation axis of a first lattice segment which is an axis of symmetry of said lattice segment, will correspond to an equivalent axis of symmetry of the adjoining second lattice segment to obtain a close pack bubble storage configuration. The pattern may contain segments of a hexagonal lattice connected by 60° turns or segments of a square lattice connected by 90° turns. The bubbles are propagated along the pattern consisting, preferably, of C-bar or chevron type permalloy elements by a rotating magnetic field in the plane of the pattern. There are substantially the same number of elements in the propagation pattern as there are bubbles in the lattice that are affected by the propagation elements. The closed loop is folded at least once to form a number of straight regions joined by 60° turns in the case of a hexagonal lattice or 90° turns in the case of a square lattice. In one preferred embodiment, the closed loop is folded twice. In a preferred embodiment, the folded closed loop propagation pattern is surrounded by a region of non-propagating bubbles retained by permalloy dot confinement means.

BEST MODE FOR CARRYING OUT THE INVENTION

We first describe the bubble lattice closed loop propagation pattern according to the invention. Referring to the FIGURE, the bubble device 10 contains a pattern having a plurality of closed end loops 12A, B, C, D, E, F, G and H. Loop 12B has 6 more propagation elements than loop 12A. Similarly, loop 12C has 6 more elements than loop 12B and so forth. The propagation elements of loop 12B are located in a uniform lattice relationship with respect to the elements of loop 12A. Similarly, the elements of loop 12C are located in a uniform lattice relationship with respect to the elements in loop 12B and so forth. The elements in loops 12A-H are C-bar type propagation elements which are well known in the art. C-bar or chevron type elements are preferred although other propagation elements may be suitable for this application. In order to facilitate the initialization of bubbles in the lattice, it is desirable to employ propagation means having one element per bubble in the lattice.

Loops 12A-H contain straight portions 14A, 14B, 15A, 15B, 16A and 16B. Loops 12A-H contain segments of a hexagonal lattice 18A, B, C, D; 20A, B, C, D; 22A, B, C, D; and 24A, B, C, D. Segments 18A-D, 20A-D, 22A-D, and 24A-D, are connected by 60° turns. The arrangement set forth in the FIGURE with the segments of a hexagonal lattice propagates bubbles along the loops 12A-H along the 3 axes of symmetry of the hexagonal lattice. As a result, no cumulative lattice distortion occurs and this makes it possible to create an endless loop of arbitrary size which can be operated with a uniform bias field. The folding of this loop provides for efficient utilization of a square or rectangular chip.

It is understood that while the preferred embodiment utilizes hexagonal lattices, it is possible to use rectangular lattices, and in particular, square lattices. When square lattices are used, the segments would be connected by 90° turns.

The bubble device 10 is surrounded by a plurality of permalloy dots 26 which retain non-propagating bubbles to confine the boundary of the close pack propagating lattice. The permalloy dots 26 which form the confinement means are completely filled with non-propagating bubbles. These non-propagating bubbles in the confinement region do not enter the loop region and by bubble-bubble repulsion prevent bubbles that are in the loop from leaving the loop to go into the confinement region.

In addition, there are central regions 28, 30 and 32 and 34 having dot elements therein for positioning of bubbles that are not in the loops 12A-H. If desired, these regions 26, 28, 30 and 32 may be used for generator and/or detector structures for example, a generator (not shown) could be placed in region 34 and the generated bubbles would be propagated along an access channel (not shown) to the loops 12A-H. In this example there would still be dots 26 in the portion of the region 34 not occupied by the generator.

EXAMPLE NO. 1

C-bar type permalloy elements were arranged to form the pattern shown in the FIGURE. A bubble material $Sm_{.25}Tm_{.95}Y_{1.55}Ca_{.75}Fe_{4.25}Ge_{.75}O_{12}$ on a $Gd_3Ga_5O_{12}$ substrate was located beneath the structure shown in the figure. An inplane field of about 1kOe was applied to the bubble material to form 3.2 μm bubbles under each element shown in the figure arranged on a hexagonal lattice having a lattice parameter of 7.2 μm, i.e., the distance between adjacent bubbles. A rotating inplane field between 40 to 50 Oe was applied to the device. The bubbles were propagated in a uniform bias field of 60 Oe perpendicular to the plane along the loop as seen under a polarizing microscope. The bubbles moved continuously around the loop in an orderly fashion without the need for generation and annihilation of bubbles. In addition, it is not necessary to have a structured buffer system. It has also been observed that when there are defects in the propagation pattern, for example, missing or deformed elements or parts of elements, that bubble lattice propagation across these defects is maintained by bubble to bubble interaction. This feature is very advantageous when compared with prior art conventional field access bubble devices where a single defect would disrupt the propagation in that path. Hence, the defect tolerance is substantially greater than in conventional devices.

This folded closed loop propagation pattern is suitable for use in devices which require a uniform bias field since the prior art close loop devices require the use of a nonuniform bias field.

INDUSTRIAL APPLICABILITY

The advantages of the bufferless field access bubble lattice in accordance with this invention are that a structured buffer region is not required. All of the loops are different in length. The length of the shortest track is the useful length for storage purposes. The extra bubbles in the longer loop are bubbles which serve as a buffer bubble. Hence, while there is no specific structure which performs the buffer function, bubbles within the individual loops and particularly more so in the outer loops, serve as buffers.

Another advantage with the structure in accordance with this invention is that this type of lattice propagation does not require a generator since the bubble initialization is accomplished by the use of sufficiently large inplane field. In contrast, linear lattices require a generator as well as an annihilator, or a means of creating and maintaining a stripe domain buffer.

Bubble lattices made in accordance with this invention are useful in applications where field access bubble lattices can be used. For example, they may be used in particular memory storage devices.

While I have illustrated and described the preferred embodiment of my invention, it is understood that I do not limit myself to the precise constructions herein disclosed and the right is reserved to all changes and modifications coming within the scope of the invention as defined in the appended claims.

I claim:

1. A closed loop propagation pattern suitable for use with a bubble lattice comprising:
    a first end portion having segments of a uniform lattice connected in a manner to provide that the propagation axis of a first lattice segment is an axis of symmetry of said lattice segment and will correspond to an equivalent axis of symmetry of the adjoining second lattice segment, said segments containing propagation elements;
    a second end portion having segments of a uniform lattice connected in a manner to provide that the propagation axis of a first lattice segment is an axis of symmetry of said lattice segment and will correspond to an equivalent axis of symmetry of the adjoining second lattice segment, said second segments containing propagation elements; and
    an intermediate portion containing propagation elements connecting said first end portion to said second end portion, said intermediate portion adapted to be folded.

2. A closed loop pattern as described in claim 1 wherein said intermediate portion is folded at least two times.

3. A closed loop pattern as described in claim 2 wherein said intermediate portion contains segments of a hexagonal lattice segments connected by 60° turns at the regions it is folded.

4. A closed loop pattern as described in claim 2 wherein said intermediate portion is folded two times.

5. The combination of the closed loop pattern described in claim 1 and confinement means positioned outside of said closed loop.

6. The combination as described in claim 5 wherein said confinement means consists of elements adapted to attract a bubble.

7. The combination as described in claim 6 including elements adapted to attract a bubble positioned in areas within said confinement means that are unoccupied by the elements in said closed loop pattern.

8. A closed loop propagation pattern suitable for use with a bubble lattice comprising:
- a first end portion having segments of a hexagonal lattice connected by 60° turns, said segments containing propagation elements;
- a second end portion having segments of a hexagonal lattice connected by 60° turns, said segments containing propagation elements; and
- an intermediate portion containing propagation elements connecting said first end portion to said second end portion, said intermediate portion adapted to be folded.

* * * * *